(12) United States Patent
Sakamoto et al.

(10) Patent No.: US 8,679,360 B2
(45) Date of Patent: Mar. 25, 2014

(54) BASE SURFACE PROCESSING METHOD AND MEMS DEVICE

(75) Inventors: Takeshi Sakamoto, Chino (JP); Junichi Takeuchi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/432,680

(22) Filed: Mar. 28, 2012

(65) Prior Publication Data

US 2012/0251783 A1 Oct. 4, 2012

(30) Foreign Application Priority Data

Apr. 1, 2011 (JP) ................. 2011-081651

(51) Int. Cl.
*B44C 1/22* (2006.01)
*H01L 21/302* (2006.01)

(52) U.S. Cl.
USPC .......... 216/83; 216/88; 216/89; 438/692

(58) Field of Classification Search
USPC ............ 216/83, 88, 89; 438/692, 745
See application file for complete search history.

(56) References Cited

U.S. PATENT DOCUMENTS

| | | | |
|---|---|---|---|
| 2006/0027934 A1* | 2/2006 | Edelstein et al. | 257/774 |
| 2008/0045015 A1 | 2/2008 | Sekiya | |
| 2010/0253743 A1 | 10/2010 | Takeuchi | |
| 2010/0255682 A1* | 10/2010 | Trickett et al. | 438/692 |
| 2010/0264455 A1* | 10/2010 | Nakazawa et al. | 257/139 |

FOREIGN PATENT DOCUMENTS

| | | |
|---|---|---|
| JP | 05-067598 | 3/1993 |
| JP | 2002-192730 | 7/2002 |
| JP | 2003-133264 | 5/2003 |
| JP | 2008-047695 | 2/2008 |
| JP | 2009-279661 | 12/2009 |
| JP | 2010-125704 | 6/2010 |
| JP | 2010-240852 | 10/2010 |

* cited by examiner

*Primary Examiner* — Shamim Ahmed
(74) *Attorney, Agent, or Firm* — Harness, Dickey & Pierce, P.L.C.

(57) ABSTRACT

A base surface processing method includes forming a protective film on a base surface; thinning a part of a base by grinding a part of the base surface; and etching a ground surface ground by the thinning.

11 Claims, 2 Drawing Sheets

BASE SURFACE PROCESSING METHOD AND MEMS DEVICE

BACKGROUND

1. Technical Field

The present invention relates a base surface processing method of grinding a base surface and smoothing a thinned base surface.

2. Related Art

In the related art, a substrate serving as a base of a MEMS device is ground so that the base is ground to a desired thickness suitable for a device formed, whereby the base is thinned. Thinning of the base is often realized by mechanical grinding using a grinder or the like, and grinding scraps and grinding residues are formed or left on a processing surface subject to grinding. Therefore, base surface processing is performed so that the ground surface is smoothed by wet-etching the processing surface to dissolve the grinding scraps and grinding residues formed on the processing surface, and the grinding residues are dissolved and removed.

JP-A-2002-192730 discloses an ink jet head manufacturing method including bonding a first silicon wafer serving as an electrode portion and a second silicon wafer serving as a vibrating plate, and then, processing a peripheral portion of the second silicon wafer. Specifically, the ink jet head manufacturing method employs a base surface processing method including grinding a region including non-bonded portions of the first and second silicon wafers, and then, processing a surface of the second silicon wafer.

However, when smoothing by wet-etching the processing surface of the ground base surface, since the base other than the ground processing surface is also etched, the base in a non-ground region which does not require smoothing is etched, so that the thickness thereof decreases. As a result, there is a problem in that the rigidity of the base necessary for movement of the base decreases, and the thinned base is broken when the base is moved. However, JP-A-2002-192730 makes no description of this problem.

Thus, there is a demand for a base surface processing method in which when etching the processing surface of the thinned base to smoothen the grinding scraps formed thereon and dissolve and remove the grinding residues, the base other than the processing surface is not dissolved by etching.

SUMMARY

An advantage of some aspects of the invention is to solve at least a part of the problems described above, and the invention can be implemented as the following forms or application examples.

Application Example 1

This application example is directed to a base surface processing method in which a base includes a first base surface and a processing surface on the first base surface that is applied with base surface processing, the method including: forming a protective film along at least an outer edge of the first base surface; thinning the base by grinding the processing surface serving as an inner edge of the protective film formed on the first base surface; and smoothing by etching the processing surface ground by the thinning.

In the above base surface processing method, the protective film is selectively formed on an outer edge portion serving as the outer edge of the first base surface by the forming of the protective film. Thus, it is possible to prevent the first base surface of the outer edge portion from being dissolved by the smoothing with etching of the processing surface serving as the inner edge of the formed protective film. Therefore, it is possible to perform base surface processing while maintaining the shape of the first base surface in the outer edge portion.

Application Example 2

In the base surface processing method according to the application example, it is preferable that the protective film formed by the forming of the protective film is formed by a vapor deposition method.

In the above base surface processing method, since the vapor deposition method is used in the forming of the protective film, by covering a region which does not require formation of the protective film with a masking plate or the like, it is possible to selectively form the protective film in the outer edge portion.

Application Example 3

In the base surface processing method according to the above application example, it is preferable that the method further includes the forming of the protective film on the entire surface of the base; and the grinding of the processing surface serving as an inner edge of the first base surface along the outer edge of the first base surface of the base.

In the above base surface processing method, by forming the protective film on the entire surface of the base by the forming of the protective film, the protective film reinforces the base, and damage during movement of the base and attachment of scraps can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
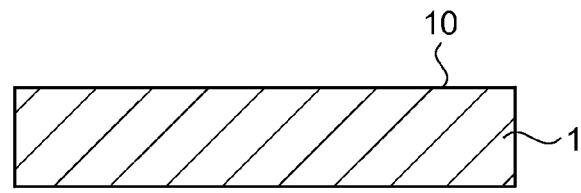
FIGS. 1A to 1E are schematic views showing steps of a base surface processing method according to a first embodiment.

Hereinafter, embodiments will be described based on the drawings. In the respective drawings shown below, respective constituent elements are drawn to dimensions and scales appropriately different from those of actual constituent elements so that the respective constituent elements are depicted in such a size as to be recognized in the drawings.

First Embodiment

FIGS. 1A to 1E are schematic views showing steps of a base surface processing method according to the present embodiment and a base 1 to be subject to base surface processing. The base surface processing method will be described using FIGS. 1A to 1E.

The steps of performing the base surface processing method of the present embodiment include a protective film forming step of forming a protective film 201 on a first base surface 10 of the base 1, a thinning step of grinding the first base surface 10, and an etching step of smoothing the first base surface 10 ground by the thinning step.

FIG. 1A is a schematic view showing the base 1 to be subject to the base surface processing. The base 1 includes the first base surface 10 to be subject to the base surface processing. In the present embodiment, a silicon substrate is used as the base 1.

Figure 1B:
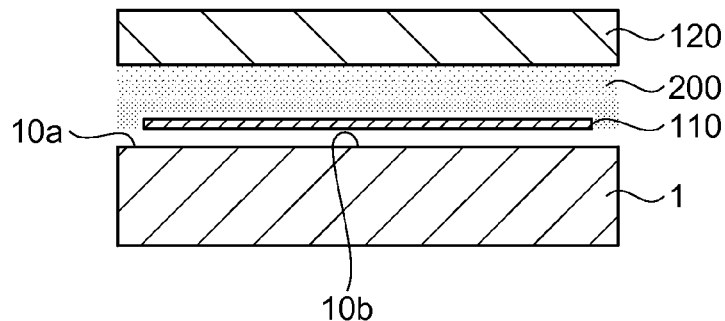

FIG. 1B is a schematic view showing the protective film forming step of forming the protective film 201 on an outer edge portion 10a of the first base surface 10. In the protective film forming step shown in FIG. 1B, a film is formed by depositing a film material 200 constituting the film on the first base surface 10 by a vapor deposition method. In the present embodiment, the protective film 201 is formed using a plasma CVD (Chemical Vapor Deposition) method. When forming the protective film 201 using the plasma CVD method, the base 1 on which the protective film 201 is to be formed is placed on parallel flat-plate electrodes (not shown) provided in a reactor (not shown). Then, high-frequency waves are applied to the parallel flat-plate electrodes on which the base 1 is placed, and raw-material halide gas serving as the film material 200 of the protective film 201 and carrier gas such as hydrogen or nitrogen are introduced into the reactor from a shower plate 120, whereby a plasma state is created, and the gases are decomposed. The decomposed raw-material gas and carrier gas cause the film material 200 to be precipitated on a surface of the first base surface 10 of the base 1 placed on the parallel flat-plate electrodes to form the protective film 201.

Here, when forming the protective film 201, in order to form the protective film 201 on the outer edge portion 10a of the first base surface 10, a processing surface 10b of the first base surface 10 which does not require formation of the protective film 201 is covered with a masking plate 110. In this way, the protective film 201 is selectively formed on the outer edge portion 10a.

Figure 1C:
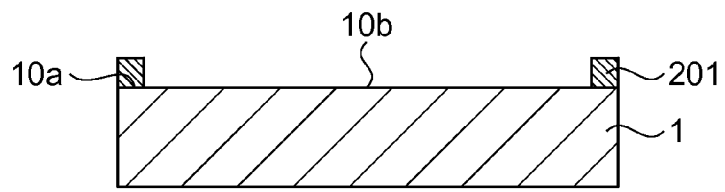

FIG. 1C is a schematic view showing a state where the protective film 201 is formed on the first base surface 10, and the thinning step starts. In the thinning step shown in FIG. 1C, the processing surface 10b serving as an inner edge of the outer edge portion 10a on which the protective film 201 is formed by the protective film forming step is ground, whereby the base 1 serving as the outer edge portion 10a is left non-ground, and the base 1 of the processing surface 10b is thinned.

Figure 1D:
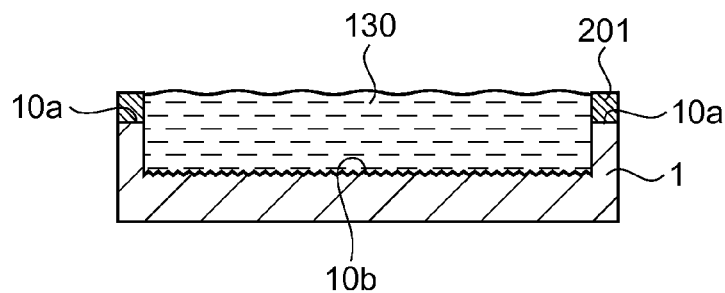

FIG. 1D is a schematic view showing an etching step of smoothing the processing surface 10b thinned by grinding the processing surface 10b. In the etching step shown in FIG. 1D, the processing surface 10b is smoothed using a wet-etching method of dissolving (hereinafter referred to as "etching") grinding scraps and grinding residues on the processing surface 10b formed by the grinding in the thinning step with an aqueous solution 130 containing effective components capable of dissolving the base 1. In the etching step, the base 1 is horizontally rotated while facing the first base surface 10 and the aqueous solution 130 is dropped onto a central portion of the processing surface 10b. The aqueous solution 130 flows toward the outer edge portion 10a with a centrifugal force generated by the rotation of the base 1. In this way, etching of the processing surface 10b is achieved. The flowing aqueous solution 130 moves over the protective film 201 formed on the outer edge portion 10a and flows out of the base 1. The aqueous solution 130 used in the etching step of the present embodiment contains hydrofluoric acid.

Figure 1E:
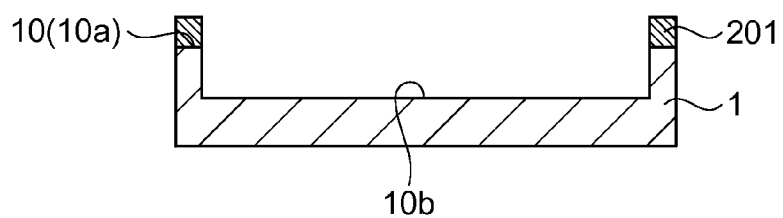

FIG. 1E is a schematic view showing the base 1 after the base surface processing method of the present embodiment is finished. In the base 1 shown in FIG. 1E, the protective film 201 is formed in a portion serving as the outer edge portion 10a by the protective film forming step, the processing surface 10b is ground by the thinning step, and the processing surface 10b is smoothed by the etching step. In this way, a series of the base surface processing ends. In the base 1 in which the base surface processing is finished, the shape of the first base surface 10 of the outer edge portion 10a on which the protective film 201 is formed is maintained.

According to the first embodiment, the following advantages are obtained.

In the base surface processing method of the present embodiment, since the protective film 201 is formed using the vapor deposition method, it is possible to selectively form the protective film 201 on the outer edge portion 10a of the first base surface 10. Therefore, it is possible to prevent the base 1 constituting the outer edge portion 10a from being etched by the etching step of smoothing the processing surface 10b and to maintain the shape of the first base surface 10 of the outer edge portion 10a. Therefore, it is possible to realize the base surface processing method capable of reinforcing the thinned base 1 with the base 1 constituting the outer edge portion 10a and suppressing a breaking of the base 1 when the base 1 is moved.

Second Embodiment

FIGS. 2A to 2D are schematic views showing a base surface processing method according to the present embodiment. The base surface processing method according to the present embodiment will be described with reference to FIGS. 2A to 2D. In the base surface processing method of the present embodiment, the configuration of a protective film 301 is different from that of the protective film 201 of the first embodiment. Since the other configurations are the same as those of the first embodiment, the same configuration and steps will be denoted by the same reference numerals, and description thereof will be simplified or omitted.

The base surface processing method of the present embodiment includes a protective film forming step of forming a protective film on the base 1, a thinning step of grinding the first base surface 10 and an etching step of smoothing the processing surface 10b ground by the thinning step in a manner similarly to the first embodiment.

Figure 2A:
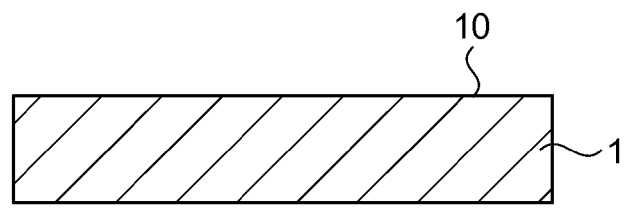
FIGS. 2A to 2D are schematic views showing steps of a base surface processing method according to a second embodiment.

FIG. 2A is a schematic view showing the base 1 subject to the base surface processing. Similarly to the first embodiment, the base surface processing is performed on the first base surface 10. A silicon substrate is used as the substrate 1.

Figure 2B:
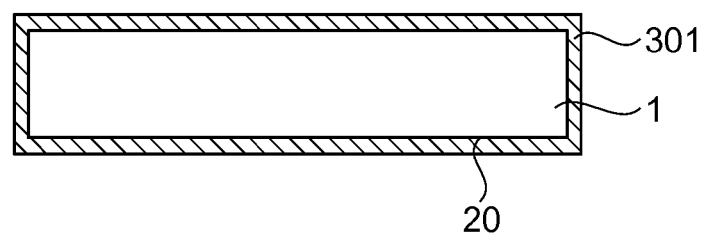

FIG. 2B is a schematic view showing a state where the protective film 301 is formed on the base 1 by the protective film forming step. In the protective film forming step shown in FIG. 2B, the protective film 301 is formed on a portion serving as a surface of the base 1 including the first and second base surfaces 10 and 20 of the base 1. In the protective film forming step of the present embodiment, a thermal oxidation film is formed on the base 1 as the protective film 301 using a thermal oxidation method. Here, the thermal oxidation film serving as the protective film 301 is formed in such a manner that the base 1 is placed in an atmosphere heated using a thermal oxidation device (not shown), oxygen or vapor is filled into the atmosphere, silicon constituting the base 1 reacts with oxygen present in the atmosphere, whereby the protective film 301 formed of the thermal oxidation film is formed on the surface of the base 1.

Figure 2C:
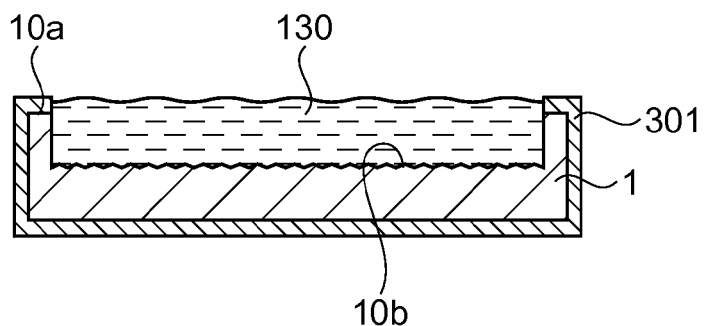

FIG. 2C is a schematic view showing a state where the thinning step of thinning the processing surface 10b of the first base surface 10 is finished and shows the etching step of smoothing the processing surface 10b. First, in the thinning step of the present embodiment, the processing surface 10b serving as the inner edge of the outer edge portion 10a of the first base surface 10 is ground similarly to the first embodiment. Subsequently, in the etching step, the aqueous solution 130 is dropped onto the processing surface 10b, and the grinding scraps and grinding residues formed on the processing surface 10b by the thinning step are dissolved by etching similarly to the first embodiment to thereby smooth the processing surface 10b.

Figure 2D:
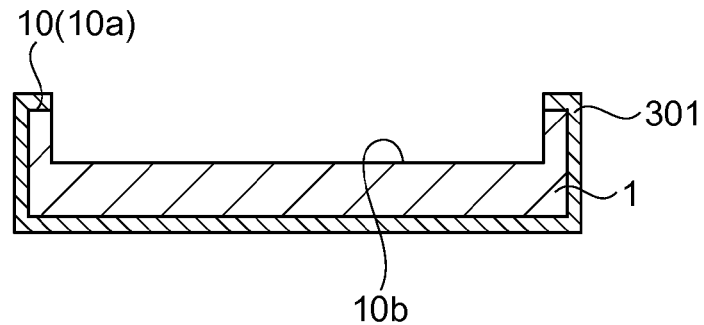

FIG. 2D is a schematic view showing the base 1 after the base surface processing method of the present embodiment is finished. In the base 1 shown in FIG. 2D, the protective film 301 is formed on the surface of the base 1 including the first and second base surfaces 10 and 20 by the protective film forming step, the processing surface 10b is ground by the thinning step, and the processing surface 10b is smoothed by the etching step. In this way, a series of the base surface processing ends. In the base 1 in which the base surface processing is finished, the shape of the first base surface 10 of the outer edge portion 10a on which the protective film 301 is formed is maintained.

According to the second embodiment, the following advantages are obtained.

In the base surface processing method of the present embodiment, since the protective film 301 formed of the thermal oxidation film is formed on the entire surface of the base 1, it is possible to further reinforce the thinned base 1 with the protective film 301 and to suppress breaking and attachment of scraps when the base 1 is moved.

In the base surface processing method of the present embodiment, the protective film 301 formed of the thermal oxidation film is more rigid than the protective film 201 formed using the vapor deposition method. Thus, it is possible to further suppress the breaking and attachment of scraps when the base 1 is moved. Moreover, since the thermal oxidation film is used as the protective film 301, it is possible to decrease a formation cost such as raw material costs required for forming the protective film 301 and energy associated with the formation as compared to the protective film 201 formed using the vapor deposition method.

The invention is not limited to the above-described embodiments, and various changes and improvements can be made without departing from the spirit of the invention. Modification examples will be described below.

Modification Example 1

In the protective film forming step of the first embodiment, the protective film 201 is formed on the outer edge portion 10a of the first base surface 10 by the CVD method. However, the invention is not limited to this, and the protective film 201 may be formed by depositing a substance which becomes the protective film 201 by an evaporation method.

Modification Example 2

In the protective film forming step of the second embodiment, the protective film 301 is formed on the entire surface of the base 1 including the first base surface 10 and the second base surface 20 by the thermal oxidation method. However, the invention is not limited to this, and the protective film 301 may be formed using the vapor deposition method such as the CVD method or the evaporation method.

The entire disclosure of Japanese Patent Application No. 2011-081651, filed Apr. 1, 2011 is expressly incorporated by reference herein.

What is claimed is:

1. A base surface processing method in which a base includes a first base surface and a processing surface defined by a portion of the first base surface that is applied with base surface processing, the method comprising:
   forming a protective film on a peripheral edge of the first base surface to overlap the first base surface at a position adjacent the processing surface;
   thinning the base by grinding the processing surface at least at locations inboard from an inner edge of the protective film; and
   smoothing by etching the processing surface grounded by the thinning.

2. The base surface processing method according to claim 1, wherein the protective film formed by the forming of the protective film is formed by a vapor deposition method.

3. The base surface processing method according to claim 1, wherein the protective film formed by the forming of the protective film is formed by a thermal oxidation method.

4. The base surface processing method according to claim 1, wherein the base is a silicon base.

5. The base surface processing method according to claim 1, further comprising:
   the forming of the protective film on the entire surface of the base; and
   the thinning the base by grinding the processing surface serving as an inner edge of the first base surface along the outer edge of the first base surface of the base.

6. A base surface processing method comprising:
   providing an etching protective film on a base surface of a base;
   grinding a part of the base surface not covered by the protective film to form a thinned part of the base; and
   etching a grounded surface of the thinned part of the base.

7. The base surface processing method of claim 1, wherein the processing surface is not covered by the protective film.

8. A processing method, comprising:
   providing a base having a first surface and a second surface opposite to the first surface;
   overlapping a protective film at least over a periphery of the first surface, a region of the first surface located inboard from the protective film defining a processing surface;
   grinding the processing surface to form a grounded surface, a thickness of the base at the grounded surface being less than a thickness of the base where the protective film is located; and
   etching the grounded surface to smooth the grounded surface.

9. The base surface processing method according to claim 8, wherein the protective film is formed by a vapor deposition method.

10. The base surface processing method according to claim 8, wherein the protective film is formed by a thermal oxidation method.

11. The base surface processing method according to claim 8, wherein the base is made from silicon.

* * * * *